United States Patent [19]
Maugans

[11] 3,755,742
[45] Aug. 28, 1973

[54] SINGLE TURRET MECHANISM FOR GENERATING TUNING VOLTAGES FOR A VOLTAGE TUNED AM-FM RADIO RECEIVER

[75] Inventor: Terrance W. Maugans, Kokomo, Ind.

[73] Assignee: General Motors Corporation, Detroit, Mich.

[22] Filed: Apr. 21, 1972

[21] Appl. No.: 245,839

[52] U.S. Cl. ................ 325/459, 74/10.15, 74/10.27, 325/455, 325/465
[51] Int. Cl. ............................................. H04b 1/16
[58] Field of Search ............... 74/10.1, 10.15, 10.27; 325/452, 458, 459, 465, 470

[56] References Cited

UNITED STATES PATENTS

| | | | |
|---|---|---|---|
| 2,433,389 | 12/1947 | Newton | 74/10.15 |
| 2,934,964 | 5/1960 | Parsons | 74/10.15 |
| 3,290,604 | 12/1966 | Bell | 325/459 |
| 3,593,226 | 7/1971 | Weigel | 325/465 |

*Primary Examiner*—Robert L. Griffin
*Assistant Examiner*—William S. Moore
*Attorney*—C. R. Meland, Howard N. Conkey et al.

[57] ABSTRACT

An apparatus for generating tuning voltages for a voltage tuned AM-FM radio receiver including a turret having a plurality of potentiometer assemblies circumferentially spaced therearound, the wiper arms of the potentiometer assemblies being positioned so as to generate voltages for tuning the tuned circuits in the AM and FM sections of the radio receiver. A first manually operable ratchet mechanism rotates the turret so as to position alternate potentiometer assemblies at a tuning station and simultaneously switches the radio receiver for operation in the AM frequency band. A second manually operable ratchet mechanism rotates the turret to sequentially position the remaining potentiometers at the tuning station and simultaneously switches the radio receiver for reception in the FM frequency band. A voltage is picked off the potentiometer at the tuning station and supplied to the receiver to effect tuning thereof. A tuning mechanism is manually actuated and latched into engagement with a drive mechanism for the wiper arm of the potentiometer assembly positioned at the tuning station and is operable to position the wiper arm to generate the desired tuning voltage. An unlatching mechanism is provided for unlatching the tuning mechanism upon operation of either of the first or second ratcheting mechanisms.

3 Claims, 9 Drawing Figures

SINGLE TURRET MECHANISM FOR GENERATING TUNING VOLTAGES FOR A VOLTAGE TUNED AM-FM RADIO RECEIVER

This invention relates to an apparatus for generating tuning voltages for a voltage tuned radio receiver and, more specifically, this invention relates to a single turret mechanism for generating tuning voltages for AM and FM sections of a voltage tuned radio receiver whereby the desired voltages are obtained by the use of a single tuning mechanism.

Conventional radio receivers include tuned circuits which are tuned to the desired frequency by means of a slug tuned coil. This form of receiver requires the physical placement of the slug in the tuned coil to effect tuning. As opposed to this conventional form of tuning, electronically tuned circuits have been developed including a voltage responsive reactive element in each tuned circuit which tunes the circuit in response to an applied voltage. In this form of tuning circuit, the receiver is tuned to the desired frequency by varying the magnitude of the voltage applied to the various voltage responsive reactive elements. It is the general object of this invention to provide an apparatus for generating tuning voltages for tuning this type of radio receiver.

It is another object of this invention to provide an apparatus for generating tuning voltages for both the FM and AM portions of the radio receiver with the tuning being effected by means of a single tuning mechanism.

It is another object of this invention to provide an apparatus for supplying tuning voltages to the AM and FM portions of a radio receiver in which a plurality of tuning voltages corresponding to desired frequencies are memorized in each of the AM and FM bands.

It is another object of this invention to provide an apparatus for supplying tuning voltages to a voltage tuned AM-FM radio receiver including a turret which carries a plurality of potentiometers whose wiper arms are tuned by a single tuning mechanism with a portion of the potentiometers being associated with tuning in the AM frequency band and the remaining potentiometers being associated with tuning of the radio receiver in the FM frequency band.

These and other objects of this invention may be best understood by reference to the following description of the preferred embodiment of this invention and the drawings in which.

Figures 1, 2:
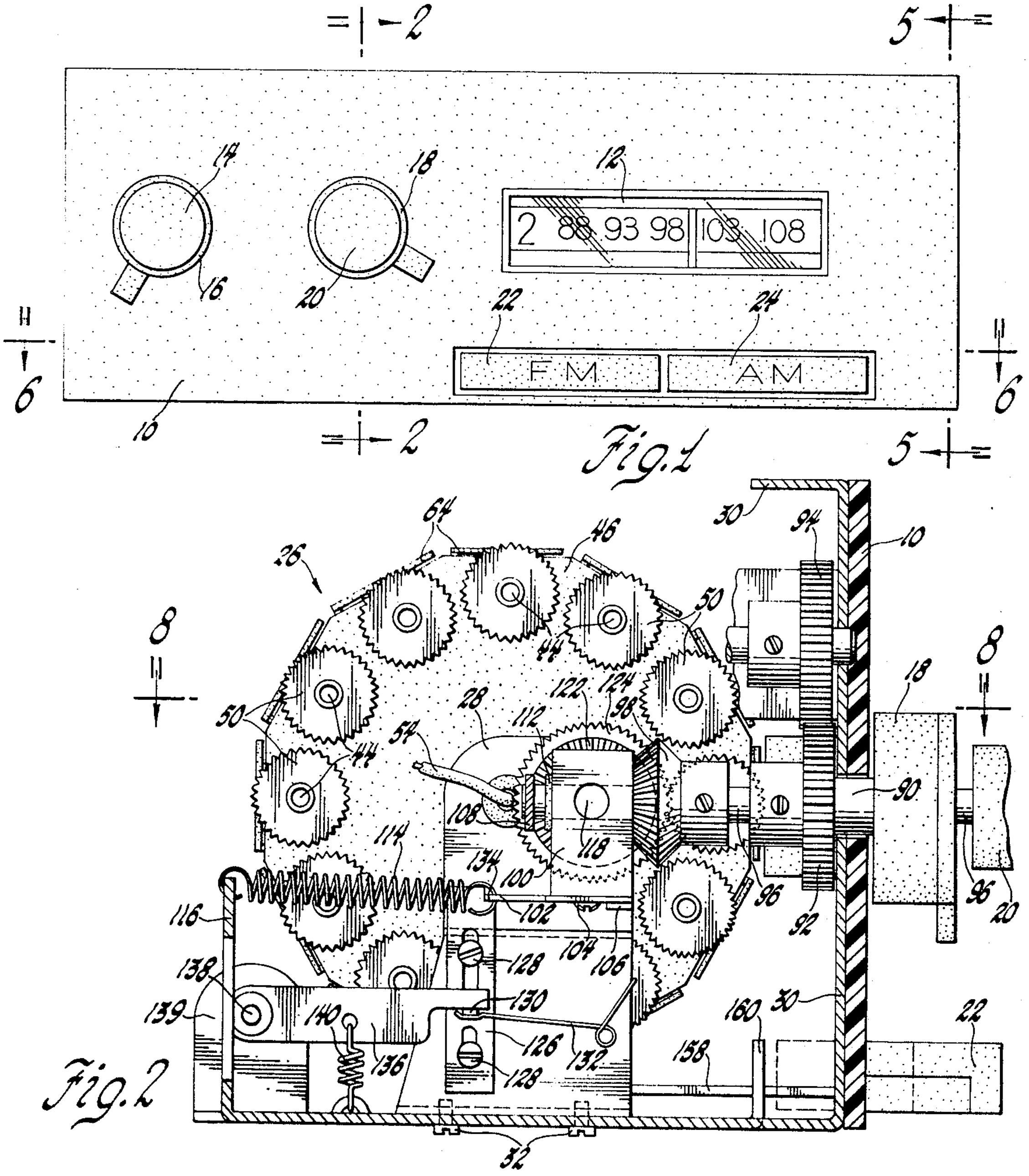
FIG. 1 is a front elevation of the tuning voltage generator illustrating the various control elements.
FIG. 2 is a schematic drawing of the tuning mechanism as viewed along lines 2—2 of FIG. 1.

Referring to FIG. 1, a face plate 10 is shown having a transparent viewing window 12 through which indicia relating to frequencies in the AM or FM frequency bands can be viewed. An on-off volume control knob 14, a tone control knob 16, a speaker balance control knob 18 and a tuning knob 20 are provided to perform the conventional functions represented thereby when manually operated. A push button 22 is provided for sequentially selecting a number of memorized FM tuning voltages representing desired frequencies in the FM frequency band and for switching the radio receiver for reception in the FM frequency band and a push button 24 is provided for sequentially selecting a number of memorized AM tuning voltages representing desired frequencies in the AM frequency band and for switching the radio receiver for reception in the AM frequency band.

Figures 4, 5:
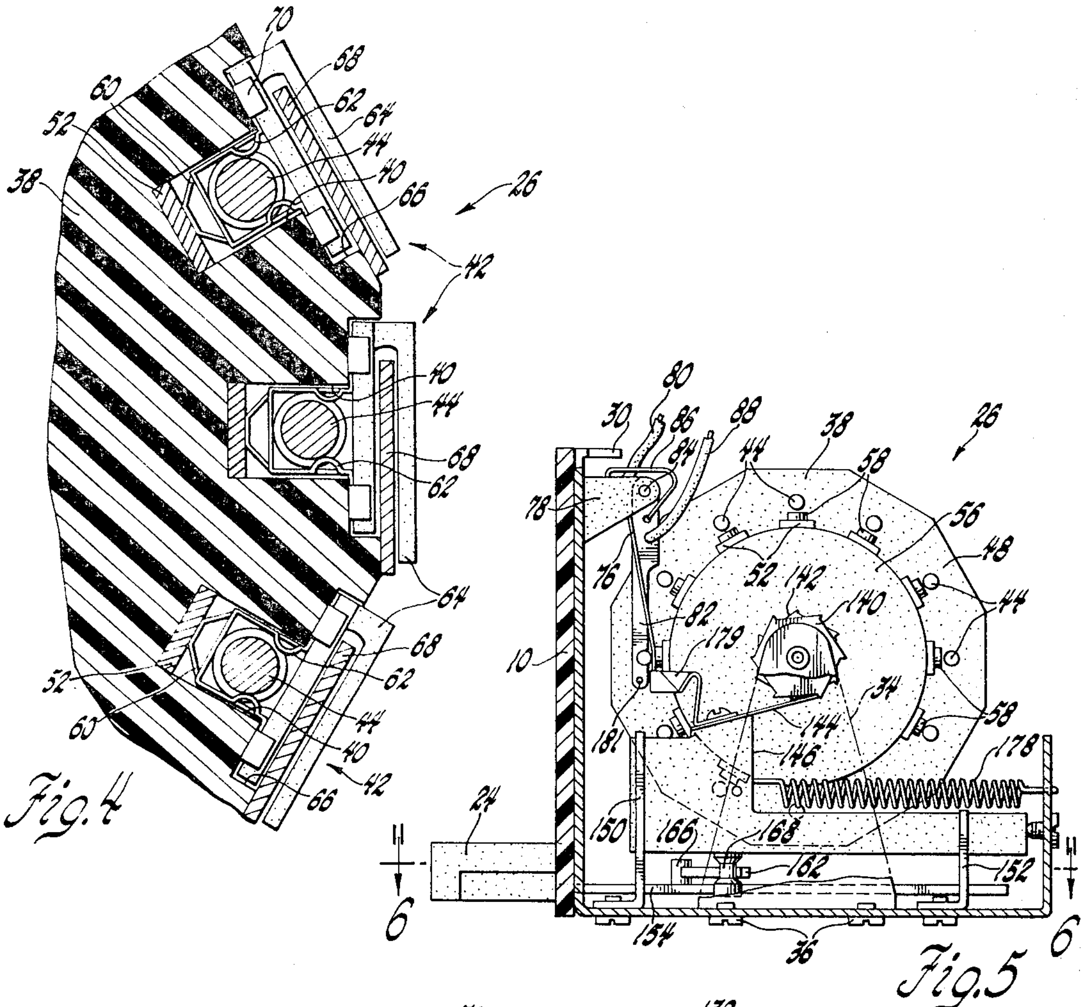
FIG. 4 is a cross-sectional view of the turret for memorizing tuning voltages for tuning the AM and FM portions of the radio receiver.
FIG. 5 is a schematic drawing of the ratcheting mechanisms for rotating the turret as viewed along lines 5—5 of FIG. 1.
Figure 7:
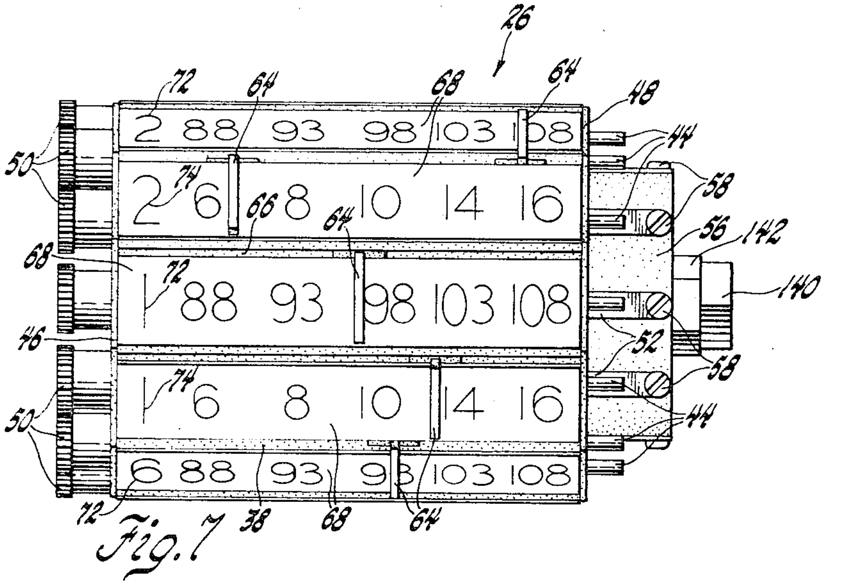
FIG. 7 is a schematic drawing of the turret for memorizing voltages representing various frequencies in the AM and FM frequency bands.

Referring to FIG. 7, there is shown a turret 26 having one end mounted, as shown in FIG. 2, in a bracket 28 for rotational movements relative thereto, the bracket 28 being secured to a support structure 30 by screws 32 and the other end mounted, as shown in FIG. 5, in a bracket 34 for rotational movements relative thereto, the bracket 34 being secured to the support member 30 by the screws 36.

Referring to FIGS. 4 and 7, the turret 26 is comprised of a polygon insulator 38 having 12 sides. The insulator 38 is shown having 12 sides for illustration purposes only. The number of sides equals the number of frequencies which can be memorized in the AM and FM frequency bands and can be any desired even numbered integer. The insulator 38 includes on each side thereof a groove 40 for housing a potentiometer assembly 42.

Each potentiometer assembly 42 includes an electrically conductive threaded screw 44 extending the length of the polygon insulator 38 within the groove 40 and being mounted for rotation in an end plate 46 and an end plate 48, both of which are composed of insulating material and are secured to the ends of the polygon insulator 38. The ends of each of the threaded screws 44 project through the respective end plates 46 and 48. The end of each of the threaded screws 44 which projects through the end plate 46 has mounted thereon a gear 50. A resistive strip 52 is mounted at the bottom of each of the grooves 40 and extends the length of the polygon insulator 38. One end of each of the resistive strips 52 is electrically coupled internal of the polygon insulator 38 to a ground wire 54 of FIG. 2, which is connected to an external ground (not shown). The remaining end of each of the resistive strips 52 is connected to a projection 56 of the polygon insulator 38 by means of contact screws 58. Each potentiometer assembly 42 also includes a wiper arm 60 which contacts the resistive strip 52 and includes projections 62 which engage the threads of the screw 44. Each of the potentiometer assemblies 42 has associated therewith an indicator needle 64 which is comprised of a substantially U-shaped insulating material having one leg disposed in a groove 66. The indicator needle 64 is held in this position by an indicator plate 68 which is glued or otherwise secured to the polygon insulator 38 with a leg of the indicator needle 64 being disposed on each side thereof. Tabs 70 engage each side of one leg of the indicator needle 64 (one side shown) so as to position the indicator needle 64. Alternate indicator plates 68 are marked with indicia representing frequencies in the FM frequency band with the remaining indicator plates 68 being marked with indicia representing frequencies in the AM frequency band. In addition, the indicator plates 68 containing indicia representing frequencies in the FM frequency band are sequentially numbered by the numerals 72 while the indicator plates 68 marked with indicia representing frequencies in the AM frequency band are sequentially numbered by the numerals 74. The indicator plates 68 and the indicator needles 64 cooperate to provide an indication of the tuned frequency of the receiver.

Referring to FIG. 5, the face plate 10 is secured to the support structure 30 which contains an opening cooperating with the viewing window 12 of FIG. 1. The relative positions of the turret 26 and the viewing window 12 are such that as the turret 26 is rotated, the indicator plates 68 are sequentially positioned behind the viewing window 12, at which position the indicia representing frequencies in either the AM or FM frequency band, the indicator needle 64 and one of the numerals 72 or 74 can be observed.

When an indicator plate 68 is positioned directly behind the viewing window 12, a voltage is applied across the resistive strip 52 of the potentiometer assembly 42 associated with that plate. This is accomplished by means of a contactor 76, one end of which engages the contact screw 58 of that potentiometer assembly 42 associated with the indicator plate 68 directly behind the viewing window 12. The remaining end of the contactor 76 is mounted in an insulating member 78 and is internally connected to a power supply lead 80 which is connected to a voltage source (not shown). The insulating member 78 is rigidly secured to the support structure 30. The resulting voltage at the wiper arm 60 of that potentiometer assembly 42 (and consequently the potential of the threaded screw 44 thereof) constitutes the tuning voltage for the AM or FM portions of the receiver and is picked off the portion of the threaded screw 44 extending beyond the end plate 48 by a signal pick-off member 82 which is pivoted about a pin 84 mounted in the insulating member 78. A spring 86 biases the signal pick-off member 82 in the counterclockwise direction and against the end of the threaded screw 44. The portion of the signal pick-off member 82 which engages the threaded screw 44 is notched so as to lock the turret 26 and prevent rotation thereof until the member 82 is disengaged from the threaded screw. The voltage of the wiper arm 60 is coupled through the signal pick-off member 82 to the lead 88. This potential is supplied to the radio receiver to effect tuning thereof. As hereinafter referred to, the term "tuning station" refers to the position directly behind the viewing window 12. A particular potentiometer assembly 42 is in the tuning station when the plate 68 associated therewith is positioned adjacent the viewing window 12 where power is applied to the contact screw 58 by the contactor 76 and in which the tuning voltage is picked off by the signal pick-off member 82. When the turret 26 is rotated, the various potentiometer assemblies 42 are sequentially positioned in the tuning station with the voltage represented by the position of the respective potentiometer wiper arms 60 being supplied for tuning the radio receiver.

Figure 3:
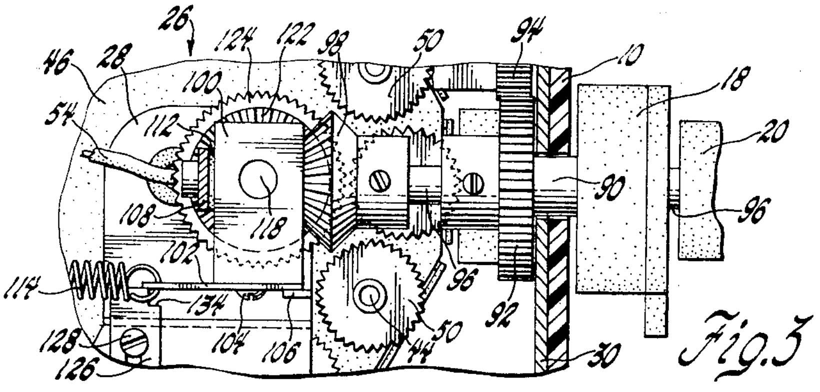
FIG. 3 is a partial schematic of the tuning mechanism illustrating the neutral position thereof.
Figure 8:
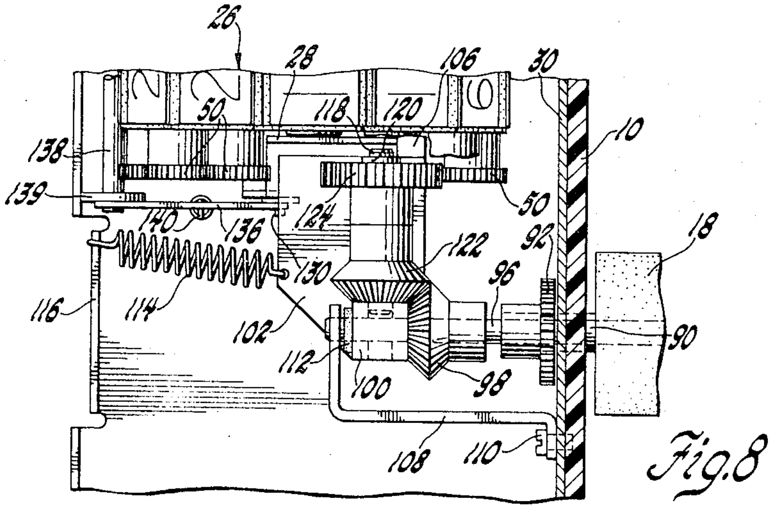
FIG. 8 is a schematic of the tuning mechanism as viewed along lines 8—8 of FIG. 2.

When one of the potentiometer assemblies 42 is in the tuning station, the voltage picked off by the signal pick-off 82 may be varied to vary the tuned frequency of the radio receiver by actuation of the tuning knob 20 as shown in FIGS. 2, 3 and 8. Referring to those figures, the speaker balance control knob 18 is coupled to a hollow shaft 90 having a gear 92 secured thereto for rotation with the speaker balance control knob 18. The gear 92 meshes with and drives a gear 94 which, when rotated, is effective to provide speaker balance control. The tuning knob 20 is coupled to a shaft 96 which extends through the hollow shaft 90, a gear 98 and a support post 100. The gear 98 is secured to the shaft 96 for rotation therewith, the shaft having rotational freedom of movement within the support post 100 and freedom of movement both rotationally and laterally through the hollow shaft 90. The support post 100 is mounted on a plate 102 by a screw 104. One end of the plate 102 rests on a tab 106 extending from the bracket 28 and the remaining end is supported by the combination of the shaft 96 and a bracket 108, the shaft 96 projecting through the bracket which is secured to the support structure 30 by a screw 110. A lock washer 112 is positioned on the shaft 96 and adjacent to the support post 100 so as to lock the support post 100 between the gear 98 and the lock washer 112 to maintain the post 100 and the shaft 96 rigid with respect to lateral movements of the shaft 96 while yet permitting rotational movement of the shaft 96. A tension spring 114 is secured to the plate 102 and to a projection 116 of the support structure 30 so as to bias the plate 102 laterally until the lock washer 112 engages the bracket 108. A shaft 118 has one end mounted in the support post 100 and the remaining end mounted in a projection 120 of the plate 102. A gear 122 is secured to the shaft 118 and meshes with the gear 98. A gear 124 is also secured to the shaft 118 and is aligned with the gear 50 associated with the potentiometer assembly 42 which is in the tuning station. The gear 124 meshes with the gear 50 associated with the potentiometer assembly 42 positioned in the tuning station, as seen in FIGS. 2 and 8, when the tuning knob 20 is pulled to move the shaft 96 and consequently the support post 100 and the plate 102 against the bias of the spring 114. When the tuning knob 20 is rotated to rotate the shaft 96, the gear 98 is rotated to rotate the gears 122 and 124. When the tuning knob 20 is pulled so as to engage the gear 124 and the gear 50, the gear 50 is rotated to position the wiper arm 60 in the potentiometer assembly 42 positioned in the tuning station.

When the tuning knob 20 is actuated to engage the gears 124 and 50 as previously described, a latching mechanism including a latching plate 126 functions to latch those gears into engagement irrespective of the return force of the spring 114. The latching plate 126 has a pair of slots therein through which a pair of screws 128 mount the latching plate 126 to the bracket 28. The slots permit relative movement between the bracket 28 and the latching plate 126. The latching plate 126 includes a tab 130 which is engaged by a wire spring 132 which biases the latching plate 126 in an upward position. The latching plate 126 also includes a notch 134 (best seen in FIG. 3) for engaging the plate 102 when in a latching position. As seen in FIG. 8, when the tuning knob 20 is in a neutral position where the gears 124 and 50 are out of engagement, the plate 102 does not engage the notch 134 in the latching plate 126. When the tuning knob 20 is actuated so as to engage the gears 124 and 50, as shown in FIGS. 2 and 8, the plate 102 is moved to permit the spring 132 to position the latching plate 126 upward so that the notch 134 engages the plate 102. Thereafter when the tuning knob 20 is released, the latching plate 126 maintains the gears 124 and 50 in engagement irrespective of the return force of the spring 114. When latched in this position, rotation of the tuning knob is effective to rotate the gear 50 to position the wiper arm 60 in the potentiometer 42 which is positioned in the tuning station. This is effective to vary the voltage picked off by the contactor 76 in FIG. 5 to a voltage representing the desired frequency in the AM or FM frequency bands.

To unlatch the tuning mechanism, an unlatching lever 136 is secured to a shaft 138 and engages the upper portion of the tab 130. The shaft 138 is mounted for rotation in a bracket 139. As will hereinafter be described, the shaft 138 is rotated clockwise to move the latching plate 126 against the force of the spring 132 to permit the spring 114 to move the plate 102 into the neutral position shown in FIG. 3. A spring 140 maintains the unlatching lever 136 against the tab 130 with a force insufficient to move the latching plate 126 against the force of the spring 132.

Figure 6:
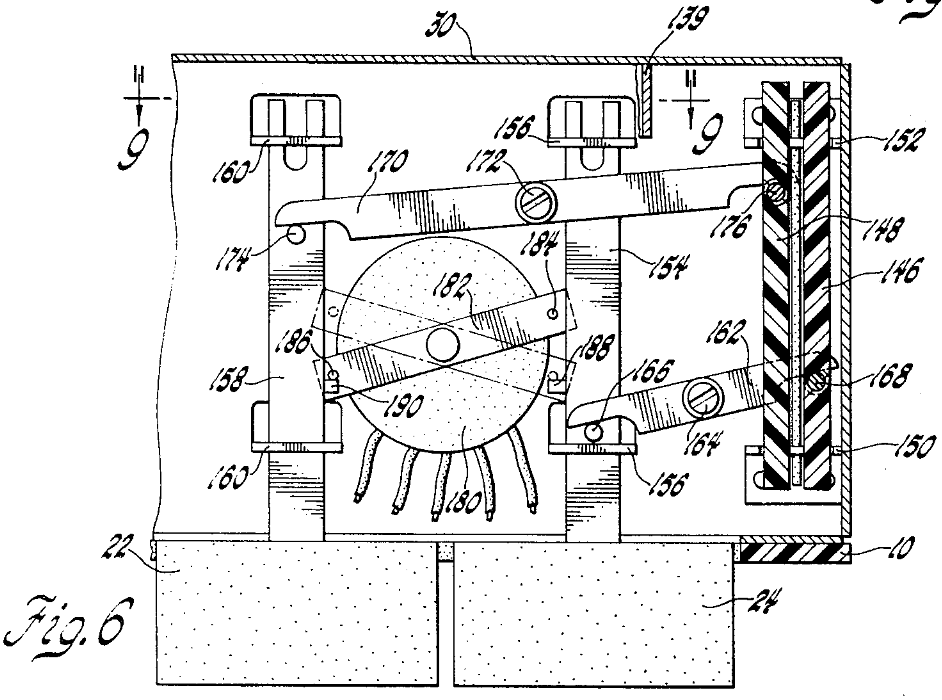
FIG. 6 is a schematic drawing of the apparatus for actuating the ratcheting mechanisms as viewed along lines 6—6 of FIG. 1.

Referring to FIGS. 5 and 6, there is shown the ratcheting mechanism for rotating the turret 26 to position the desired potentiometer assembly 42 at the tuning station for selectively tuning the AM or FM portions of a radio receiver. A pair of ratchet wheels 140 and 142 are mounted on a portion of the polygon insulator 38 extending centrally therefrom as best seen in FIG. 7. The outer ratchet wheel 140 is associated with the AM frequency band and the inner ratchet wheel 142 is associated with the FM frequency band. Each of the ratchet wheels 140 and 142 has a number of teeth equal to one-half the total number of potentiometer assemblies 42 spaced around the turret 26. The ratchet wheels 140 and 142 are rotated relative to one another such that the teeth on the ratchet wheel 140 are associated with the alternate potentiometer assemblies 42 on the turret 26 which are associated with the indicator plates 68 marked with the numerals 74 and the teeth of the ratchet wheel 142 are associated with the remaining alternate potentiometer assemblies 42 which are associated with the indicator plates 68 marked with the numerals 72. A pawl 144 is mounted on a pawl transport 146 and a pawl similar to the pawl 144 is mounted on a pawl transport 148. The pawl associated with the pawl transport 148 is not visible in FIG. 5 as it is directly behind the pawl 144 associated with the pawl transport 146. The pawl transports 146 and 148 are mounted in brackets 150 and 152 and have lateral freedom of movement relative thereto, the positions of the brackets 150 and 152 being such that the pawl 144 is directly in line with the ratchet wheel 140 and the corresponding pawl related to the pawl transport 148 is directly in line with the ratchet wheel 142.

An actuating member 154 is attached to the push button 24 and is positioned through guide slots in tabs 156 which extend upward from the bottom of the support structure 30. An actuating member 158 is attached to the push button 22 and is positioned through slots in tabs 160 which extend upward from the bottom of the support strucutre 30. A lever 162 is secured to the support structure 30 by a screw 164. The screw 164 defines a pivot point about which the lever 162 may rotate. A pin 166 attached to the actuating member 144 engages one end of the lever 162 the opposite end of which engages a pin 168 on the bottom of the pawl transport 146. In like manner, a lever 170 is secured to the support structure 30 by a screw 172. The screw 172 defines a pivot point about which the lever 170 rotates. A pin 174 on the actuating member 158 engages one end of the lever 170 whose remaining end engages a pin 176 on the bottom of the pawl transport 148. A spring 178 is attached to the pawl transport 146 and the back of the support member 30 so as to maintain the pin 168 into engagement with the lever 162. The force exerted by the pin 168 on the lever 162, resulting from the force of the spring 178, rotats the lever 162 about the screw 164 to maintain the push button 24 in its extended position. A similar spring is associated with the pawl transport 148, the spring not being visible in FIG. 5 as it is directly behind the spring 178. Consequently, the push button 22 is maintained in its extended position as a result of the force exerted by the pin 176 on the lever 170. When the push button 24 is pushed inward, the lever 162 is rotated by the pin 166 against the pin 168 to move the pawl transport 146 against the return force of the spring 178. A member 179, which is secured to the pawl transport 146, engages a pin 181 on the signal pick-off member 82 which is moved to release the turret 26 for rotation. When the push button 24 is fully depressed, the pawl 144 engages the following tooth on the ratchet wheel 140. When the push button 24 is released, the spring 178 returns the pawl transport 146 and the push button 24 to their original positions while simultaneously rotating the turret 26 to position one of the potentiometer assemblies 42 associated with the ratchet wheel 140 at the tuning station. The signal pick-off member 82 is also again effective for locking the turret 26 by the engagement of the notch thereon against the threaded screw 44. As can be seen, repeated actuations of the push button 24 position alternate potentiometer assemblies 42 at the tuning station while the remaining potentiometer assemblies 42 are rotated through the tuning station. In like manner, when the push button 22 is depressed, the pawl transport 148 is moved so that the pawl associated therewith engages the following tooth on the ratchet wheel 142. Although not visible, a member identical to the member 179 engages the pin 181 to release the turret 26 for rotation. Upon releasing the push button 22, the spring associated with the pawl transport 148 returns the pawl transport 148 and the push button to the original positions while simultaneously rotating the turret 26 to position one of the potentiometer assemblies 42 associated with the ratchet wheel 142 at the tuning station while the potentiometer assemblies 42 associated with the ratchet wheel 140 are rotated through the tuning station.

To provide for switching between AM and FM frequency bands, a switch 180 is provided which is mounted to the bottom of the support structure 30. The switch 180 includes an actuating lever 182 having a pin 184 and a pin 186 secured to each end thereof. A projection 188 on the actuating member 154 engages the pin 184 when the push button 24 is depressed to rotate the actuating member 182 to the position shown which is effective for switching the receiver for AM reception. Consequently, the potentiometer assemblies 42 associated with the push button 24 which are positioned at the tuning station when the push button 24 is actuated are effective for tuning the radio receiver in the AM frequency band. Conversely, a projection 190 on the actuating member 158 is effective for engaging the pin 186 for rotating the actuating member 182 to the dotted line position which is effective for switching the receiver for FM reception. Consequently, the potentiometer assemblies 42 associated with the push button 22 are effective for tuning the receiver for FM reception.

To provide for memorization of various tuning voltages corresponding to desired frequencies in the AM frequency band, the push button 24 is repeatedly actuated to position the alternate potentiometer assemblies 42 associated therewith in the tuning station. While those potentiometer assemblies 42 are in the tuning station, the respective wiper arms 60 are positioned at the desired position by the tuning knob in the manner previously described. Conversely, for providing for a number of memorized voltages corresponding to desired frequencies in the FM frequency band, the push button 22 is repeatedly actuated to sequentially position the remaining potentiometer assemblies at the tuning station with the wiper arm 60 of each potentiometer assembly being positioned by the tuning knob in the manner previously described. Thereafter to switch between AM and FM reception and for selecting one of the memorized voltages corresponding to a desired frequency, it is only necessary to actuate the push button 22 or the push button 24 until the potentiometer assembly 42 generating the voltage corresponding to that frequency is at the tuning station.

Figure 9:
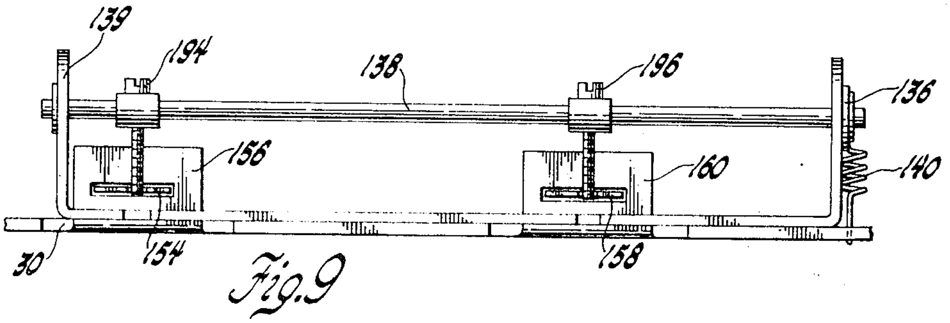
FIG. 9 is a schematic drawing of the unlatching mechanism for the tuning mechanism as viewed along lines 9—9 of FIG. 6.

As previously described with respect to the tuning mechanism, the tuning knob 20 is actuated to latch the gear 124 into engagement with the gear 50 of the potentiometer assembly 42 positioned in the tuning station. To unlatch the tuning mechanism, the shaft 138 is mounted in the bracket 139 as previously described, the bracket 139 being secured, as seen in FIG. 9, to the support structure 30 directly behind the actuating member 154 and the actuating member 158. A screw 194 is positioned in the shaft 138 so as to be engaged by the end of the actuating member 154 when the push button 24 is depressed to rotate the shaft 138 and simultaneously to rotate the unlatching lever 136 in FIG. 2 to unlatch the tuning mechanism as previously described. A second screw 196 is positioned in the shaft 138 so as to be engaged by the actuating member 158 when the push button 22 is depressed. When the actuating member 158 engages the screw 196, the shaft 138 is rotated to rotate the unlatching lever 136 as previously described to unlatch the tuning mechanism.

The detailed description of the preferred embodiment of the invention for the purpose of explaining the principles thereof is not to be conisdered as limiting or restricting the invention, since many modifications may be made by the exercise of skill in the art without departing from the scope of the invention.

I claim:

1. An apparatus for generating tuning voltages for a receiver operating in first and second frequency bands comprising a support structure; a turret carried by the support structure for rotational movement relative thereto; first and second sets of potentiometer assemblies, said sets having an equal number of potentiometer assemblies, each of the potentiometer assemblies in the first and second sets including a pair of power input terminals, a signal output terminal, a wiper arm and wiper arm drive means for positioning the wiper arm when said wiper arm drive means is actuated; means for mounting the potentiometer assemblies of the first and second sets alternately on the turret; a tuning station positioned adjacent the turret so that each of the potentiometer assemblies of the first and second sets are sequentially positioned at the tuning station when the turret is rotated, the tuning station including signal pick-off means for engaging the signal output terminal of the potentiometer assembly of one of the first or second sets which is positioned at the tuning station; means for applying a voltage across the power input terminals of the potentiometer assembly of one of the first or second sets which is positioned at the tuning station, said potentiometer assembly supplying a tuning voltage at the signal output terminal thereof having a magnitude directly related to the position of the wiper arm thereof; first manually operable indexing means for rotating the turret to position the potentiometer assemblies of the first set at the tuning station in a sequential manner upon repeated actuation of said indexing means and moving the potentiometer assemblies of the second set through said tuning station; second manually operable indexing means for rotating the turret to position the potentiometer assemblies of the second set at the tuning station in a sequential manner upon repeated actuation of said indexing means and moving the potentiometer assemblies of the first set through said tuning station; means for supplying the tuning voltage picked off by the signal pick-off means to the receiver to effect tuning thereof; switch means for switching the receiver for operation in the first frequency band when the first manually operable indexing means is operated and for switching the receiver for operation in the second frequency band when the second manually operable indexing means is operated; and manually operable tuning means for actuating the wiper arm drive means of the potentiometer assembly of the first or second set positioned at the tuning station to position the wiper arm thereof to vary the tuning voltage at its signal output terminal to a magnitude corresponding to a desired frequency in the first or second frequency band respectively, whereby the operation of the first manually operable indexing means positions one of the potentiometers of the first set at the tuning station, the tuning voltage at the output terminal thereof effecting tuning of the receiver in the first frequency band and the operation of the second manually operable indexing means positions one of the potentiometers of the second set at the tuning station, the tuning voltage at the output terminal thereof effecting tuning of the receiver in the second frequency band.

2. An apparatus for generating tuning voltages for a receiver operating in first and second frequency bands comprising a support structure; a turret carried by the support structure for rotational movement relative thereto; first and second sets of potentiometer assemblies, said sets having an equal number of potentiometer assemblies, each of said potentiometer assemblies of the first and second sets including a pair of power input terminals, a signal output terminal, a wiper arm and wiper arm drive means for positioning the wiper arm when said wiper arm drive means is actuated; means for mounting the potentiometer assemblies of the first and second sets alternately on the turret; a tuning station positioned adjacent the turret so that each of the potentiometer assemblies of the first and second sets are sequentially positioned at the tuning station when the turret is rotated, the tuning station including signal pick-off means for engaging the signal output terminal of the potentiometer assembly of one of the first or second sets which is positioned at the tuning station; means for applying a voltage across the power input terminals of the potentiometer assembly of one of the first or second sets which is positioned at the tuning station, said potentiometer assembly supplying a tuning voltage at the signal output terminal thereof having a magnitude directly related to the position of the wiper arm thereof; a first ratchet wheel attached to the turret for rotation therewith, said first ratchet wheel having circumferentially spaced indexing portions; first pawl means for sequentially engaging the indexing portions of the first ratchet wheel upon repeated actuations of said first pawl means to sequentially position the potentiometer assemblies of the first set at the tuning station and moving the potentiometer assemblies of the second set through said tuning station; first manually operable actuating means for actuating said first pawl means when said manually operable actuating means is operated; a second ratchet wheel attached to the turret for rotation therewith, said second ratchet wheel having circumferentially spaced indexing portions; second pawl means for sequentially engaging the indexing portions of the second ratchet wheel upon repeated actuations of said second pawl means to sequentially position the potentiometer assemblies of the second set at the tuning station and moving the potentiometer assemblies of the first set through said tuning station; second manually operable actuating means for actuating the first pawl means when said manually operable means is operated; means for supplying the tuning voltage picked off by the signal pick-off means to the receiver to effect tuning thereof; switch means for switching the receiver for operation in the first frequency band when the first manually operable actuating means is operated and for switching the receiver for operation in the second frequency band when the second manually operable actuating means is operated; and manually operable tuning means for actuating the wiper arm drive means of the potentiometer assembly of the first or second set positioned at the tuning station to position the wiper arm thereof to vary the tuning voltage at its output terminal to a magnitude corresponding to a desired frequency in the first or second frequency bands, respectively, whereby the operation of the first manually operable actuating means positions one of the potentiometer assemblies of the first set at the tuning station, the tuning voltage at the output terminal thereof effecting tuning of the receiver in the first frequency band and the operation of the second manually operable actuating means positions one of the potentiometer assemblies of the second set at the tuning station, the tuning voltage at the output terminal effecting tuning of the receiver in the second frequency band.

3. An apparatus for generating tuning voltages for a receiver operating in the AM and FM frequency bands, comprising a support structure; a turret carried by the support structure for rotational movement relative thereto; first and second sets of potentiometer assemblies, said sets having an equal number of potentiometer assemblies, each of the potentiometer assemblies of the first and second sets including a pair of power input terminals, a signal output terminal, a wiper arm and wiper arm drive means for positioning the wiper arm when said wiper arm drive means is actuated; means for mounting the potentiometer assemblies of the first and second sets alternately on the turret; a tuning station positioned adjacent the turret so that each of the potentiometer assemblies of the first and second sets are sequentially positioned at the tuning station when the turret is rotated, the tuning station including signal pick-off means for engaging the signal output terminal of the potentiometer assembly of one of the first or second sets which is positioned at the tuning station; means for applying a voltage across the power input terminals of the potentiometer assembly of one of the first or second sets which is positioned at the tuning station, said potentiometer assembly supplying a tuning voltage at the signal output terminal thereof having a magnitude directly related to the position of the wiper arm thereof; a first ratchet wheel attached to the turret for rotation therewith, said first ratchet wheel having circumferentially spaced indexing portions; first pawl means for sequentially engaging the indexing portions of the first ratchet wheel upon repeated actuations of said first pawl means to sequentially position the potentiometer assemblies of the first set at the tuning station and moving the potentiometer assemblies of the second set through said tuning station; first manually operable actuating means for actuating said first pawl means when said manually operable actuating means is operated; a second ratchet wheel attached to the turret for rotation therewith, said second ratchet wheel having circumferentially spaced indexing portions; second pawl means for sequentially engaging the indexing portions of the second ratchet wheel upon repeated actuations of said second pawl means to sequentially position the potentiometer assemblies of the second set at the tuning station and moving the potentiometer assemblies of the first set through said tuning station; second manually operable means for actuating the second pawl means when said manually operable means is operated; means for supplying the tuning voltage picked off by the signal pick-off means to the receiver to effect tuning thereof, switch means for switching the receiver for operation in the AM frequency band when the first manually operable actuating means is operated and for switching the receiver for operation in the FM frequency band when the second manually operable actuating means is operated; manually operable tuning means, said tuning means having a neutral position and a drive position at which the tuning means engages to actuate the potentiometer drive means of the potentiometer assembly of the first or second set which is positioned in the tuning station; biasing means for biasing the tuning means in the neutral position; latching means for latching the tuning means in the drive position when said tuning means is positioned from the neutral position to the drive position; and unlatching means for unlatching the tuning means when one of the first or second manually operable actuating means is operated, the tuning means being returned to its neutral position by the biasing means, whereby the operation of the first manually operable actuating means positions one of the potentiometers of the first set at the tuning station, the tuning voltage at the output terminal thereof effecting tuning of the receiver in the AM frequency band and operation of the second manually operable actuating means positions one of the potentiometers of the second set at the tuning station, the tuning voltage at the output terminal thereof effecting tuning of the receiver in the FM frequency band.

* * * * *